United States Patent
Newman et al.

(10) Patent No.: US 10,014,429 B2
(45) Date of Patent: Jul. 3, 2018

(54) SEMICONDUCTOR STRUCTURES INCLUDING BONDING LAYERS, MULTI-JUNCTION PHOTOVOLTAIC CELLS AND RELATED METHODS

(71) Applicant: Soitec, Crolles (FR)

(72) Inventors: Fred Newman, Seattle, WA (US);
Frank Reinhardt, Glencoe, MO (US);
Chantal Arena, Mesa, AZ (US)

(73) Assignee: SOITEC, Bernin (FR)

( * ) Notice: Subject to any disclaimer, the term of this patent is extended or adjusted under 35 U.S.C. 154(b) by 165 days.

(21) Appl. No.: 14/749,334

(22) Filed: Jun. 24, 2015

(65) Prior Publication Data

US 2015/0380592 A1    Dec. 31, 2015

Related U.S. Application Data

(60) Provisional application No. 62/017,727, filed on Jun. 26, 2014.

(51) Int. Cl.
*H01L 31/06* (2012.01)
*H01L 31/04* (2014.01)
(Continued)

(52) U.S. Cl.
CPC .... *H01L 31/0687* (2013.01); *H01L 31/03042* (2013.01); *H01L 31/03046* (2013.01);
(Continued)

(58) Field of Classification Search
CPC .............. H01L 31/0687; H01L 31/043; H01L 31/03042; H01L 31/03046;
(Continued)

(56) References Cited

U.S. PATENT DOCUMENTS

| 5,972,790 A | 10/1999 | Arena et al. |
| 6,936,103 B2 | 8/2005 | Reinhardt |

(Continued)

FOREIGN PATENT DOCUMENTS

| CN | 1373499 A | 10/2002 |
| CN | 1531751 A | 9/2004 |

(Continued)

OTHER PUBLICATIONS

International Search Report for International Application No. PCT/IB2015/000898, dated Sep. 9, 2015, 4 pages.
(Continued)

*Primary Examiner* — Didarul Mazumder
(74) *Attorney, Agent, or Firm* — TraskBritt

(57) ABSTRACT

A method of fabricating a semiconductor structure includes the formation of a first bonding layer at least substantially comprised of a first III-V material on a major surface of a first element, and formation of a second bonding layer at least substantially comprised of a second III-V material on a major surface of a second element. The first bonding layer and the second bonding layer are disposed between the first element and the second element, and the first element and the second element are attached to one another at a bonding interface disposed between the first bonding layer and the second bonding layer. Semiconductor structures are fabricated using such methods.

11 Claims, 2 Drawing Sheets

(51) Int. Cl.
*H01L 31/18* (2006.01)
*H01L 31/0687* (2012.01)
*H01L 31/0693* (2012.01)
*H01L 31/0304* (2006.01)
*H01L 31/043* (2014.01)

(52) U.S. Cl.
CPC ...... *H01L 31/03048* (2013.01); *H01L 31/043* (2014.12); *H01L 31/0693* (2013.01); *H01L 31/184* (2013.01); *H01L 31/1844* (2013.01); *H01L 31/1852* (2013.01); *H01L 31/1892* (2013.01); *Y02E 10/544* (2013.01)

(58) Field of Classification Search
CPC ........... H01L 31/03048; H01L 31/0693; H01L 31/184; H01L 31/1844; H01L 31/1852; H01L 31/1892; Y02E 10/544
USPC .......................................................... 438/57
See application file for complete search history.

(56) References Cited

U.S. PATENT DOCUMENTS

| | | | |
|---|---|---|---|
| 7,732,306 B2 | 6/2010 | Arena et al. | |
| 7,785,989 B2 | 8/2010 | Sharps et al. | |
| 7,785,995 B2 | 8/2010 | Cody et al. | |
| 8,187,907 B1 | 5/2012 | Newman | |
| 8,436,363 B2 | 5/2013 | Werkhoven et al. | |
| 8,642,995 B2 | 2/2014 | Arena | |
| 8,692,260 B2 | 4/2014 | Arena et al. | |
| 8,765,508 B2 | 7/2014 | Arena | |
| 8,836,081 B2 | 9/2014 | Arena | |
| 9,012,919 B2 | 4/2015 | Lindow et al. | |
| 9,023,721 B2 | 5/2015 | Arena et al. | |
| 2004/0200407 A1 | 10/2004 | Reinhardt | |
| 2006/0292744 A1* | 12/2006 | Enquist | H01L 21/2007 438/107 |
| 2009/0078309 A1 | 3/2009 | Cornfeld et al. | |
| 2009/0078311 A1 | 3/2009 | Stan et al. | |
| 2009/0188561 A1 | 7/2009 | Aiken et al. | |
| 2010/0012174 A1 | 1/2010 | Varghese et al. | |
| 2010/0072576 A1* | 3/2010 | Arena | H01L 21/02521 257/615 |
| 2010/0109126 A1 | 5/2010 | Arena | |
| 2010/0122764 A1 | 5/2010 | Newman | |
| 2010/0151618 A1 | 6/2010 | Sharps et al. | |
| 2010/0206365 A1 | 8/2010 | Chumney et al. | |
| 2010/0229926 A1 | 9/2010 | Newman et al. | |
| 2010/0282305 A1 | 11/2010 | Sharps et al. | |
| 2010/0282306 A1 | 11/2010 | Sharps et al. | |
| 2010/0282307 A1 | 11/2010 | Sharps et al. | |
| 2011/0011450 A1* | 1/2011 | Arena | H01L 31/18 136/255 |
| 2011/0277829 A1* | 11/2011 | Fafard | B82Y 10/00 136/255 |
| 2011/0284863 A1 | 11/2011 | Lindow et al. | |
| 2012/0138116 A1* | 6/2012 | Bhusari | H01L 21/2007 136/244 |
| 2012/0186641 A1 | 7/2012 | Sharps et al. | |
| 2012/0211071 A1 | 8/2012 | Newman et al. | |
| 2013/0126896 A1 | 5/2013 | Lindow et al. | |
| 2013/0181308 A1 | 7/2013 | Arena et al. | |
| 2013/0244410 A1 | 9/2013 | Arena et al. | |
| 2013/0285015 A1 | 10/2013 | Arena | |
| 2014/0264408 A1 | 9/2014 | Debray et al. | |
| 2014/0326309 A1 | 11/2014 | Krause et al. | |
| 2015/0027519 A1 | 1/2015 | Ghyselen et al. | |
| 2015/0059832 A1 | 3/2015 | Ghyselen et al. | |
| 2015/0083202 A1 | 3/2015 | Ghyselen et al. | |
| 2015/0090321 A1 | 4/2015 | Cho et al. | |
| 2015/0122313 A1 | 5/2015 | Ghyselen et al. | |

FOREIGN PATENT DOCUMENTS

| | | |
|---|---|---|
| CN | 103262212 A | 8/2013 |
| WO | 0126137 | 4/2001 |

OTHER PUBLICATIONS

International Written Opinion for International Application No. PCT/IB2015/000898, dated Sep. 9, 2015, 8 pages.

Dimroth et al: "Wafer bonded four-junction GaInP/GaAs//GaInAsP/GaInAs concentrator solar cells with 44.7% efficiency", Progress in Photovoltaics: Research and Applications, vol. 22, No. 3,13 (Mar. 2014), pp. 277-282.

Christiansen et al., Wafer Direct Bonding: From Advanced Substrate Engineering to Future Applications in Micro/Nanoelectronics, Proceedings of the IEEE, vol. 94, No. 12, pp. 2060-2106 (2006).

Tong et al., Semiconductor wafer bonding: recent developments, Materials, Chemistry and Physics, vol. 37, pp. 101-127 (1994).

Office Action in Chinese Application No. 201580034477.4 dated Jan. 10, 2018, 25 pages with translatation.

Search Report in Chinese Application No. 201580034477.4 dated Dec. 28, 2018, 2 pages (translatation only).

* cited by examiner

SEMICONDUCTOR STRUCTURES INCLUDING BONDING LAYERS, MULTI-JUNCTION PHOTOVOLTAIC CELLS AND RELATED METHODS

CROSS-REFERENCE TO RELATED APPLICATION

This application claims the benefit of U.S. Provisional Patent Application Ser. No. 62/017,727, filed Jun. 26, 2014, the disclosure of which is hereby incorporated herein in its entirety by this reference.

TECHNICAL FIELD

Embodiments of the present disclosure relate to methods of fabricating semiconductor structures, and more particularly, to methods for bonding together two or more elements during fabrication of semiconductor structures, such as multi-junction photovoltaic cells, and to semiconductor structures such as multi junction photovoltaic cells that are formed using such methods.

BACKGROUND

Solar energy is an abundant resource that can provide a source of electrical energy. One method to collect and utilize solar energy is through photovoltaic (PV) cells, which convert solar energy directly into electrical energy. The conversion of energy can be provided by pn-junction diodes fabricated from n-type and p-type conductive regions in semiconductor materials. Such pn-junction diodes produce a photo-current generated when electron-hole pairs are formed in the semiconductor material. These electron-hole pairs are formed as a response to photons of electromagnetic radiation impinging on, and being absorbed within, the photovoltaic cell.

The energy absorbed by a semiconductor material is dependent on its characteristic band gap energy. The band gap energy of a semiconductor material may be defined as the amount of energy required to free an outer shell electron from its orbit about the nucleus to a free state. In semiconductor materials, the required energy for an electron to be excited from the valence band to the conduction band differs based on the energy difference between the two electronic states. Different materials have different characteristic band gap energies. Band gap engineering is the process of controlling the band gap energy of a material. Conventional silicon-based semiconductor materials used in photovoltaic cells (PVs) have a band gap energy of approximately 1.1 eV, which only covers a small portion of the solar electromagnetic radiation spectrum (e.g., from about 0.4 eV to 4.0 eV).

Photons of electromagnetic radiation having energy below the band gap energy of the semiconductor material will not be absorbed and converted to electrical energy. Photons with energy above the band gap energy may be absorbed, but electron-hole pairs that are created may quickly lose their excess energy above the bandgap energy in the form of thermal energy (i.e., heat). Thus, this excess energy is not available for conversion to electrical energy.

In order to maximize the absorption and the conversion of energy in a photovoltaic cell, multi junction (MJ) photovoltaic devices have been developed. Multi junction photovoltaic devices are made up of two or more subcells, each subcell comprising a pn-junction diode with a different characteristic band gap energy. Thus, each of the subcells has a band gap energy engineered to absorb different wavelengths of electromagnetic radiation within the solar spectrum. The two or more subcells can therefore absorb energy from different portions of the solar energy spectrum, resulting in better utilization of the solar energy and a higher operational efficiency.

Multi junction photovoltaic cells are commonly fabricated from two or more subcells formed as a vertical stack in a layer-by-layer deposition process. Each subcell is designed to absorb and convert a different portion of the solar energy spectrum than that of an adjacent subcell. The subcell first exposed to radiant energy generally has the highest band gap energy, while subcells positioned below the first subcell have correspondingly smaller band gap energies. As a result of this arrangement, energy that is not absorbed in the first subcell may be transmitted to, and converted to an electron-hole pair within, another underlying subcell of the multi junction photovoltaic device, thereby enabling a broader spectrum of solar energy to be converted into electrical energy.

However, common multi junction photovoltaic devices are limited due to the necessity to match the crystal lattice of each of the subcells during the sequential heteroepitaxial growth of the various layers of different materials over one another. Lattice mismatch between the crystal lattices in the different materials of adjacent subcells can result in mechanical strain and lattice dislocations (i.e., defects in the crystal structure) that reduce the efficiency of the photovoltaic device. As a result, materials that may be used in a typical multi junction photovoltaic cell are limited due to such lattice matching constraints.

To overcome the restriction imposed due to lattice matching concerns between two or more subcells of the multi junction photovoltaic cell during epitaxial growth processes, a bonding process may be utilized. Bonding of two or more subcells together allows a further degree of freedom in the selection of semiconductor materials that can be used to form a multi junction photovoltaic cell. The lattice mismatch may be overcome by forming two or more subcells on different substrates and then attaching the two or more subcells to one another by a bonding process.

The attachment of two or more elements is commonly performed utilizing bonding techniques. Such bonding techniques encompass a number of methods commonly referred to as, for example, molecular bonding, fusion bonding, metallic bonding, adhesive bonding, solder bonding, and direct bonding. For example, see the journal publications of Tong et al., Materials, Chemistry and Physics 37 101 1994, entitled "Semiconductor wafer bonding: recent developments," and Christiansen et al., Proceedings of the IEEE 94 12 2060 2006, entitled "Wafer Direct Bonding: from Advanced Substrate Engineering to Future Applications in Micro/Nanoelectronics."

The bonding of elements to one another is commonly assisted by the formation of one or more bonding layers on a surface of at least one of the elements to be bonded. The surface chemistry of the bonding layers can be manipulated to improve the adhesion of the two elements to one another, such that the two elements can be attached with sufficient bonding energy to enable further processing to be performed on the bonded semiconductor structure without premature separation.

Bonding layers may encompass a multitude of materials including, for example, conductors (e.g., metals), semiconductors and insulators. One of the more common bonding layers comprises a silicate such as, for example, silicon dioxide, wherein the surface chemistry of the silicon dioxide surface may comprise silanol (Si—OH) groups capable of producing high bonding energies. However, the use of insulating bonding layers may prevent the flow of electrons between the bonded elements, such as the subcells making up a multi junction photovoltaic cell. As a result, such bonding layers may not be suitable for use in devices where electrical conduction across the bonding layer is required.

The flow of electrons and, hence, electrical current between two bonded elements can be realized by utilizing metallic bonding layers. Metallic bonding layers have been produced using a number of different metallic materials such as, for example, copper and gold. However, the use of metallic bonding layers can severely limit the transmission of light through the bonded structure since metallic bonding layers may substantially prevent light transmission when the metallic layers are above a certain thickness. Therefore, metallic bonding layers may not be suitable when light transmission through the bonded elements is necessary.

BRIEF SUMMARY

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments, the present disclosure includes a method of fabricating a semiconductor structure in which a first bonding layer is formed that is at least substantially comprised of a first material. The first bonding layer is formed on a major surface of a first element. A second bonding layer is formed that is at least substantially comprised of a second III-V material, and the second bonding layer is formed on a major surface of a second element. At least one of the first bonding layer and the second bonding layer is doped with an n-type dopant, and the n-type dopant is selected to comprise at least one of selenium and tellurium. The first bonding layer and the second bonding layer are disposed between the first element and the second element, and the first element and the second element are attached to one another at a bonding interface disposed between the first bonding layer and the second bonding layer.

In additional embodiments, the present disclosure includes semiconductor structures and devices fabricated by methods described herein. For example, in some embodiments, the present disclosure includes a semiconductor structure having a first bonding layer at least substantially comprised of a first III-V material on a major surface of a first element, and a second bonding layer at least substantially comprised of a second III-V material on a major surface of a second element. The first bonding layer and the second bonding layer are disposed between the first element and the second element. At least one of the first bonding layer and the second bonding layer further comprises at least one n-type dopant, and the at least one n-type dopant may comprise at least one of selenium and tellurium. A bonding interface is disposed between the first bonding layer and the second bonding layer.

DETAILED DESCRIPTION

The illustrations presented herein are not meant to be actual views of any particular photoactive device or component thereof, but are merely idealized representations that are used to describe embodiments of the disclosure.

As used herein, the term "III-V semiconductor material" means and includes any semiconductor material that is at least predominantly comprised of one or more elements from group IIIA of the periodic table (B, Al, Ga, In, and Ti) and one or more elements from group VA of the periodic table (N, P, As, Sb, and Bi). For example, III-V semiconductor materials include, but are not limited to, GaN, GaP, GaAs, InN, InP, InAs, AlN, AlP, AlAs, InGaN, InGaP, GaInN, InGaNP, GaInNAs, etc.

As used herein, the term "epitaxial," when used in relation to deposition or growth of a semiconductor material, means the growth of a semiconductor material over an underlying material such that a crystal lattice of the semiconductor is oriented in a common orientation with a crystal lattice of the underlying material on which the semiconductor is deposited or grown. An epitaxial material is a material that is epitaxially grown or deposited.

As used herein, the term "pseudomorphic," when used in relation to deposition or growth of a semiconductor material, means the epitaxial growth of a semiconductor material over an underlying material such that an in-plane lattice parameter of the semiconductor material being grown or deposited is constrained to match the in-plane lattice parameter of the underlying material on which the semiconductor is epitaxially deposited or grown. A pseudomorphic material is a material that is pseudomorphically, epitaxially grown or deposited.

As used herein, the term "absorption edge" in relation to a material means a wavelength of electromagnetic radiation above which the absorption of electromagnetic radiation by the material is less than 10% over at least a range of wavelengths.

In accordance with embodiments of the present disclosure, two or more elements may be attached to one another utilizing a first bonding layer and a second bonding layer. Each of the two or more elements may comprise one or more photovoltaic subcells, and, in some embodiments, each of the two or more elements may comprise tandem photovoltaic cells comprising two or more subcells. Non-limiting examples of such bonding methods are described below with reference to FIGS. 1 through 3, and embodiments of methods that may be employed to fabricate multi junction photovoltaic devices are described with reference to FIG. 4.

Figure 1:
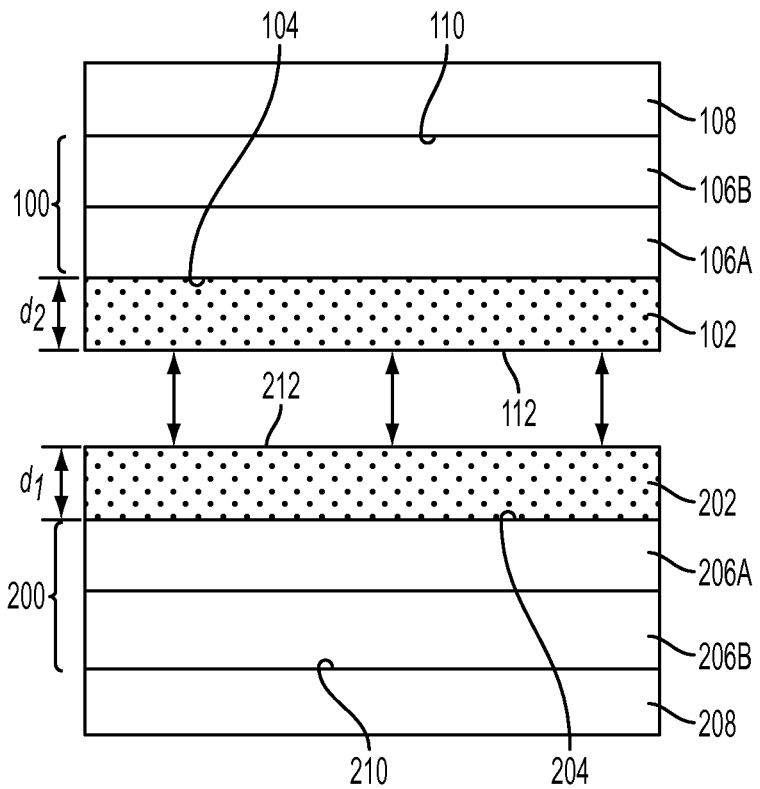
FIG. 1 is a simplified schematic diagram illustrating a first element and a second element, the first element including a major surface upon which a first bonding layer is disposed and the second element including a major surface upon which a second bonding layer is disposed.

FIG. 1 illustrates a first element 100 and a second element 200, wherein the first element 100 includes a first bonding layer 102 disposed over a major surface 104 of the first element 100, and wherein the second element 200 includes a second bonding layer 202 disposed over a major surface 204 of the second element 200.

The first element 100 and the second element 200 may comprise one or more photovoltaic subcells. The first element 100 may comprise any number of subcells, which may be formed in a layer-by-layer manner. It should also be noted that FIG. 1 is a simplified schematic view, and each of the subcells may include a plurality of layers, such as layers of semiconductor material forming one or more p-n junctions. As non-limiting examples, the one or more subcells may also include antireflective layers, tunnel diode layers, back surface field layers, by-pass diode layers, and window layers. In non-limiting example embodiments, the first element 100 may comprise a tandem solar cell including a first subcell 106A and a second subcell 106B. In addition, the second element 200 may also comprise a tandem solar cell, comprising a first subcell 206A and a second subcell 206B.

More particularly, the first element 100 may include a first subcell 106A having a composition at least substantially comprised of (except for the presence of one or more dopants) germanium (Ge). The germanium may have a bandgap energy of approximately 0.67 eV. The Ge subcell 106A includes a p-doped region and an n-doped region, which together form a first p-n junction diode. The first element 100 may include a second subcell 106B having a material composition at least substantially comprised of (except for the presence of one or more dopants) indium gallium arsenide nitride (InGaAsN) having a bandgap energy of approximately 1 eV. The InGaAsN subcell 106B includes a p-doped region and an n-doped region, which together form a second p-n junction diode.

The second element 200 may include a first subcell 206A having a composition at least substantially comprised of (except for the presence of one or more dopants) at least one of gallium arsenide (GaAs) and indium gallium arsenide (InGaAs). The material composition of the first subcell 206A may have a bandgap energy of between approximately 1.4 eV and approximately 1.5 eV. The first subcell 206A of the second element 200 includes a p-doped region and an n-doped region, which together form a third p-n junction diode. The second element 200 may include a second subcell 206B having a composition at least substantially comprised of (except for the presence of one or more dopants) indium gallium phosphide (InGaP) having a bandgap energy of approximately 1.9 eV, although the precise bandgap energy will depend on the material composition of the InGaP (i.e., the relative atomic percentages of the In and Ga in the InGaP). The InGaP subcell 206B also includes a p-doped region and an n-doped region, which together form a fourth p-n junction diode.

The non-limiting examples given herein above are used to illustrate a possible configuration and a selection of materials useful in the formation of multi junction photovoltaic cells. Each of the first element 100 and the second element 200 may comprise one or more subcells, and the subcells may comprise other semiconductor materials than those mentioned herein above.

The first element 100 may be formed on and include a first growth substrate 108 having a growth surface 110. Similarly, the second element 200 may be formed on and include a second growth substrate 208 having a growth surface 210. For example, the first growth substrate 108 may have a material composition at least substantially comprised of germanium, such that the growth surface 110 is a germanium growth surface 110. Additional embodiments of growth substrates 108 that may be utilized for the formation of the first element 100 include engineered composite substrates such as, for example, substrates including Ge disposed on sapphire (GeOS), wherein the Ge defines the growth surface 110.

The second growth substrate 208 may have a material composition at least substantially comprised of gallium arsenide (GaAs). Additional embodiments of growth substrates 208 that may be utilized for the formation of the second element 200 include engineered composite substrates such as, for example, substrates including GaAs disposed on sapphire (GaAsOS), wherein the GaAs defines the growth surface 210, or substrates including Ge disposed on sapphire (GeOS), wherein the Ge defines the growth surface 210.

The one or more subcells of each of the first element 100 and the second element 200 may be formed by one or more deposition processes (e.g., a physical vapor deposition (PVD) process or a chemical vapor deposition (CVD) process). In some embodiments, the one or more subcells are formed by an epitaxial deposition process, such as a metalorganic chemical vapor deposition (MOCVD) process, a halide vapor phase epitaxy (HYPE) process, an atomic layer deposition (ALD) process, or a combination of such processes.

With continued reference to FIG. 1, a first bonding layer 102 may be formed on the first element 100. The first bonding layer 102 may be at least substantially comprised of a first III-V material, and may be disposed on a major surface 104 of the first element 100. In other words, the first element 100 includes a major surface 104 upon which the first bonding layer 102 may be formed. The first bonding layer 102 may comprise one or more III-V materials. As a non-limiting example, the first III-V material of the first bonding layer 102 may be selected to be at least substantially comprised of (except for the presence of dopants) an indium phosphide material (InP).

In some embodiments, the first bonding layer 102 may be epitaxially grown over the major surface 104 of the first element 100. Further, in some embodiments, the first bonding layer 102 may be pseudomorphically, epitaxially grown over the first element 100 using a pseudomorphic growth process in which a crystal lattice of the first bonding layer 102 inherits the in-plane lattice parameter of the major surface 104 of the first element 100, such that the first bonding layer 102 is a pseudomorphic material.

The second bonding layer 202 may be formed on the second element 200. The second bonding layer 202 may be at least substantially comprised of a second III-V material, and may be disposed on the major surface 204 of the second element 200. In other words, the second element 200 includes a major surface 204 upon which the second bonding layer 202 may be formed. The second bonding layer 202 may comprise one or more III-V materials. As a non-limiting example, the second III-V material of the second bonding layer 202 may be selected to be at least substantially comprised of (except for the presence of dopants) at least one of a gallium arsenide material (GaAs) and a gallium indium phosphide material (GaInP).

In some embodiments, the second bonding layer 202 may be epitaxially grown over the major surface 204 of the second element 200. Further, in some embodiments, the second bonding layer 202 may be pseudomorphically, epitaxially grown over the second element 200 using a pseudomorphic growth process, in which a crystal lattice of the second bonding layer 202 inherits the in-plane lattice parameter of the major surface 204 of the second element 200, such that the second bonding layer 202 is a pseudomorphic material.

The first bonding layer 102 may have a first average layer thickness $d_1$, and the second bonding layer 202 may have an average layer thickness $d_2$ (as illustrated in FIG. 1). Each of the thicknesses $d_1$ and $d_2$ may be greater than about 10 nm, greater than 150 nm, or even greater than about 1,000 nm. The composition of each of the first bonding layer 102 and the second bonding layer 202 may be at least substantially constant throughout at least a majority of the total respective thicknesses $d_1$ and $d_2$ of the layers.

Each of the bonding layers 102, 202 optionally may also include one or more dopants. Such dopants may be incorporated during the deposition processes utilized to form each of the bonding layers 102, 202, or alternatively the dopants may be implanted into each of the bonding layers 102, 202 after growth of the bonding layers 102, 202. As a non-limiting example, one or both of the first bonding layer 102 and the second bonding layer 202 may be doped with an n-type dopant.

The n-type dopant of the bonding layers 102, 202 may be selected to comprise at least one of selenium (Se) and tellurium (Te). Se and Te have been shown to exhibit surfactant properties when utilized to dope III-V materials, and, in particular, when doping III-arsenide and III-phosphide materials. The surfactant behavior of Se and Te may be enhanced by heavily doping each of the first bonding layer 102 and the second bonding layer 202. As a non-limiting example, at least one of the first bonding layer 102 and the second bonding layer 202 may be doped at a doping concentration of at least approximately $1.5 \times 10^{19}$ cm$^{-3}$.

The surfactant behavior of Te and Se at heavy doping levels may be beneficial in forming a multi junction photovoltaic cell for a number of reasons. For example, heavy Te and Se doping may reduce the as-grown surface roughness of each of a bonding surface 112 of the first bonding layer 102 and a bonding surface 212 of the second bonding layer 202. In bonding processes known in the art, polishing processes (e.g., chemical-mechanical polishing (CMP)) are used to achieve the low surface roughness required for successful bonding processes. In embodiments presented herein, the time required for polishing processes may be reduced relative to previously known processes, or polishing processes may be eliminated since the surfactant properties of the heavily doped bonding layers 102, 202 may result in the bonding surfaces 112, 212 having as-grown surface roughnesses suitable for subsequent bonding processes. As a non-limiting example, epitaxial growth of each of the first bonding layer 102 and the second bonding layer 202 may result in the formation of an as-grown bonding surface 112, 212, respectively, having a root mean square (rms) surface roughness of less than approximately ten (10) angstroms, less than approximately five (5) angstroms, or even less than approximately three (3) angstroms.

After forming each of the first bonding layer 102 and the second bonding layer 202, the bonding layers 102, 202 may be cleaned and/or activated using processes known in the art. Such an activation process may be used to alter the surface chemistry at each of the bonding surfaces 112, 212 in a manner that facilitates a bonding process and/or results in the formation of a stronger bond between the bonding surface 112 of the first bonding layer 102 and the bonding surface 212 of the second bonding layer 202.

The heavy doping of the bonding layers 102, 202 with at least one of Te and Se may also form each of the first bonding layer 102 and the second bonding layer 202 with a high degree of electrical activation. For example the donor concentration ($N_{donor}$) in each of the bonding layers 102, 202 may be at least approximately $0.1 \times 10^{19}$ cm$^{-3}$, at least approximately $0.5 \times 10^{19}$ cm$^{-3}$, or even at least approximately $1 \times 10^{19}$ cm$^{-3}$. In non-limiting example embodiments, each of the first bonding layer 102 and the second bonding layer 202 may be formed to comprise a material having an electrical resistivity of less than approximately five (5) milli-ohm per centimeter square (5 mΩ cm$^2$), less than approximately two (2) milli-ohm per centimeter square (2 mΩ cm$^2$), or even less than approximately one milli-ohm per centimeter square (1 mΩ cm$^2$). The low resistivity of each of the first bonding layer 102 and the second bonding layer 202 may result in relatively low electrical resistance across the bonding layers 102, 202.

Heavily doping the bonding layers 102, 202 with Te and Se may provide a further advantage resulting from a Moss-Burstein reduction of the absorption edge of each of the bonding layers 102, 202 to lower wavelengths (i.e., higher absorption energies). The Moss-Burstein effect is a phenomenon in which the apparent band gap energy of a semiconductor material is increased as the absorption edge is pushed to a lower wavelength (higher energy) as a result of all the energy band states close to the conduction band being populated. This is observed for a degenerate electron distribution, such as that found in some heavily doped degenerate semiconductors. Therefore, a doping-induced Moss-Burstein reduction of the absorption edge of each of the bonding layers 102, 202 may render each of the bonding layers 102, 202 more transparent to the photon energies (i.e., wavelengths of electromagnetic radiation) of interest.

Figure 3:
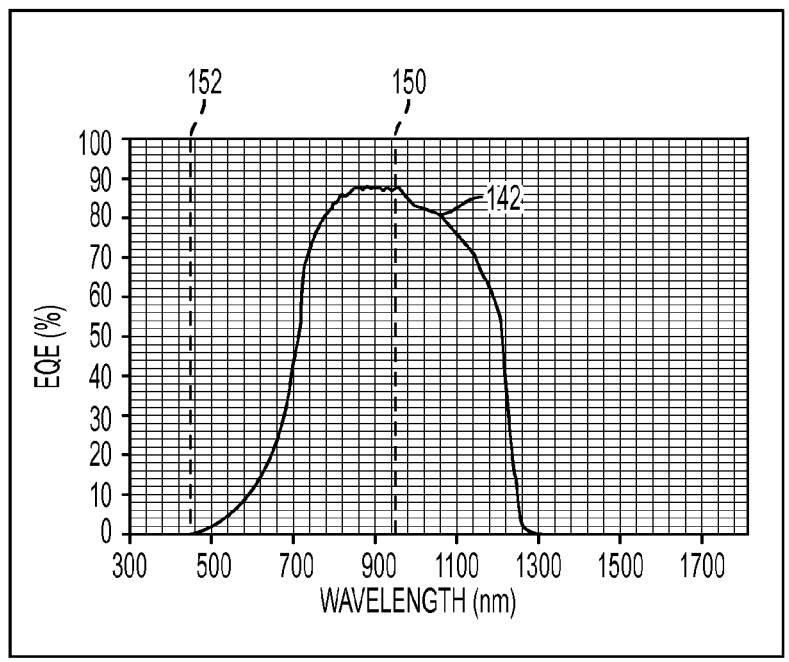
FIG. 3 illustrates a relationship between external quantum efficiency and wavelength for an example bonding layer utilized to form the semiconductor structure of FIG. 2.

As a non-limiting example, the wavelength of the absorption edge of each of the first bonding layer 102 and the second bonding layer 202 may be reduced by at least approximately two hundred fifty (250) nanometers, by at least approximately five hundred (500) nanometers, or by at least approximately seven hundred fifty (750) nanometers due to the doping of the bonding layers 102, 202 with Te and/or Se as described herein above. FIG. 3 illustrates a graph of the External Quantum Efficiency (EQE) as a function of wavelength for a bonding layer 102, 202 comprising an indium phosphide material heavily doped with selenium as described herein, which is represented in FIG. 3 by line 142.

The EQE of a photovoltaic cell is defined as the ratio of the number of charge carriers collected by the photovoltaic cell compared to the number of photons of energy incident on the photovoltaic cell. One of the parameters the EQE is dependent on is the absorption edge of the material, it is therefore possible, by reducing the absorption edge of each of the first bonding layer 102 and the second bonding layer 202, to decrease the absorption of the first bonding layer 102 and the second bonding layer 202, within a given wavelength range. The resulting decrease in absorption of the first bonding layer 102 and the second bonding layer 202 results in a corresponding increase in the EQE of the first bonding layer 102 and the second bonding layer 202.

The absorption edge of an undoped indium phosphide material is approximately 900 nanometers (e.g., about 920 nm), as indicated in FIG. 3 by the vertical dashed line 150. The bandgap energy of an undoped indium phosphide material is approximately 1.35 eV. The absorption edge of the indium phosphide material heavily doped with selenium is approximately 500 nanometers (e.g., about 480 nm), as indicated in FIG. 3 by the vertical dashed line 152. Thus, the absorption edge 152 of the heavily Se doped indium phosphide material is reduced by approximately 400 nanometers compared to the absorption edge 150 of the undoped indium phosphide material.

The reduction in the absorption edge of each of the first bonding layer 102 and the second bonding layer 202 may render the bonding layers 102, 202 at least substantially optically transparent to at least a range of wavelengths of interest such as for transmission of electromagnetic radiation through the two or more subcells 106A, 106B, 206A, 206B and the bonding layers 102, 202, which may be part of a multi junction photovoltaic cell. For example, each of the first bonding layer 102 and the second bonding layer 202 may be formed to comprise a transparent material that is at least substantially transparent to electromagnetic radiation having wavelengths in a range extending from approximately seven hundred fifty (750) nanometers to approximately nine hundred twenty (920) nanometers, or from approximately eight hundred forty (840) nanometers to approximately nine hundred twenty (920) nanometers, for example.

After forming the bonding layers 102, 202 on the first and second elements 100, 200, respectively, the bonding surface 112 of the first bonding layer 102 may be brought into contact with and bonded to the bonding surface 212 of the second bonding layer 202 using a bonding process as discussed in further detail below.

Figure 2:
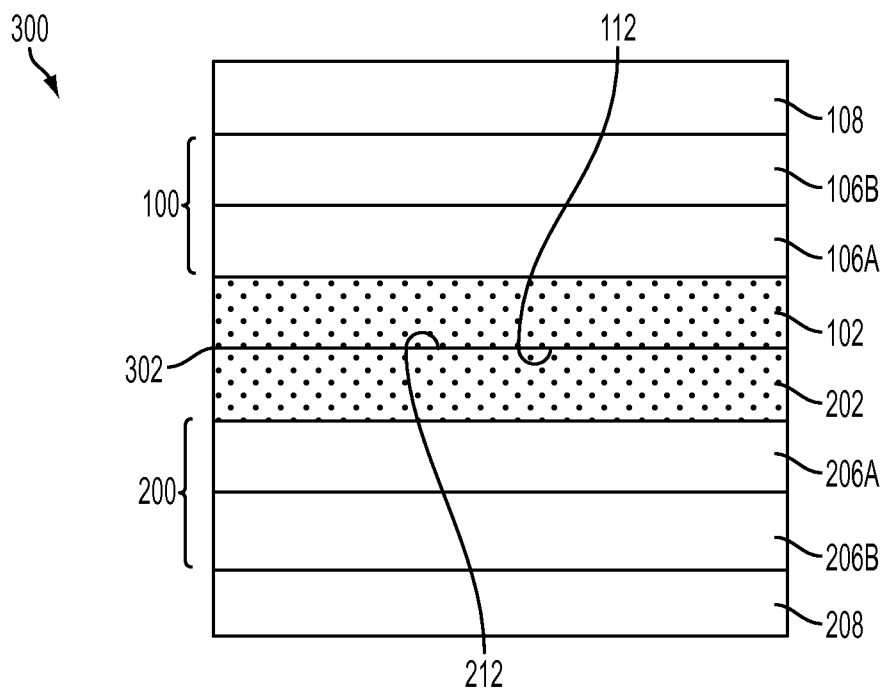
FIG. 2 illustrates a semiconductor structure formed by attaching the first element and second element to one another utilizing the first bonding layer and the second bonding layer.

FIG. 2 illustrates a semiconductor structure 300 that includes the first element 100 and the second element 200 attached to one another through the first bonding layer 102 and the second bonding layer 202. To attach the first element 100 to the second element 200, the first bonding layer 102 and the second bonding layer 202 may be disposed between the first element 100 and the second element 200, and the first element 100 and the second element 200 may be attached to one another at a bonding interface 302 disposed between the first bonding layer 102 and the second bonding layer 202.

The attachment of the first element 100 to the second element 200 utilizing each of the bonding layers 102, 202 may be attained using any of a number of methods. As a non-limiting example, the first element 100 may be bonded to the second element 200 by a direct bonding process, such as a molecular bonding process, a thermo-compression bonding process or a non-thermo-compression bonding process (i.e., bonding without the use of a glue, wax, solder, etc). For example, bonding operations may require that each of bonding surfaces 112, 212 be sufficiently smooth and free of particles and contamination, and that the surfaces 112, 212 be sufficiently close to one another to allow contact therebetween to be initiated (commonly at a distance of less than 5 nm). When brought into such proximity, the forces of attraction between bonding surface 112 and bonding surface 212 can be sufficiently high to cause direct bonding (bonding induced by all of the forces of attraction (e.g., Van Der Waals forces) resulting from the electronic interactions between the atoms or the molecules of the two bonding surfaces 112, 212 to be bonded).

The initiation of the direct bonding process is commonly achieved by application of localized pressure, for example, using a TEFLON® stylus on an element in close contact with another element in order to trigger propagation of a bonding wave from the point of initiation. The term "bonding wave" refers to the front of the direct bonds being formed spreading from the point of initiation and corresponding to the dissemination of the forces of attraction from the point of initiation over the entire interface of close contact between the first bonding layer 102 and the second bonding layer 202. Thus, the first element 100 may be bonded to the second element 200 using a direct bonding process in which a bonding interface is formed between the first bonding layer 102 and the second bonding layer 202, the bonded interface 302 comprising a direct bonding interface. It should be noted, however, that due to the nature of direct bonding processes, it may be relatively difficult or impossible to identify the direct bonding interface between the first bonding layer 102 and the second bonding layer 202, and the direct bonding interface 302 is defined as the plane along which the first bonding surface 112 and the second bonding surface 212 are disposed and across which the first bonding surface 112 and the second bonding surface 212 are bonded together by the direct bonding process.

Optionally, an annealing process may be used to strengthen the bond between the first bonding layer 102 and the second bonding layer 202 at the bonded interface 302. Such an annealing process may comprise, for example, heating the semiconductor structure 300 in a suitable furnace to a temperature or temperatures of between about one hundred degrees Celsius (100° C.) and about one thousand degrees Celsius (1,000° C.) for a time of between about two minutes (2 mins.) and about fifteen hours (15 hrs.).

Figure 4:
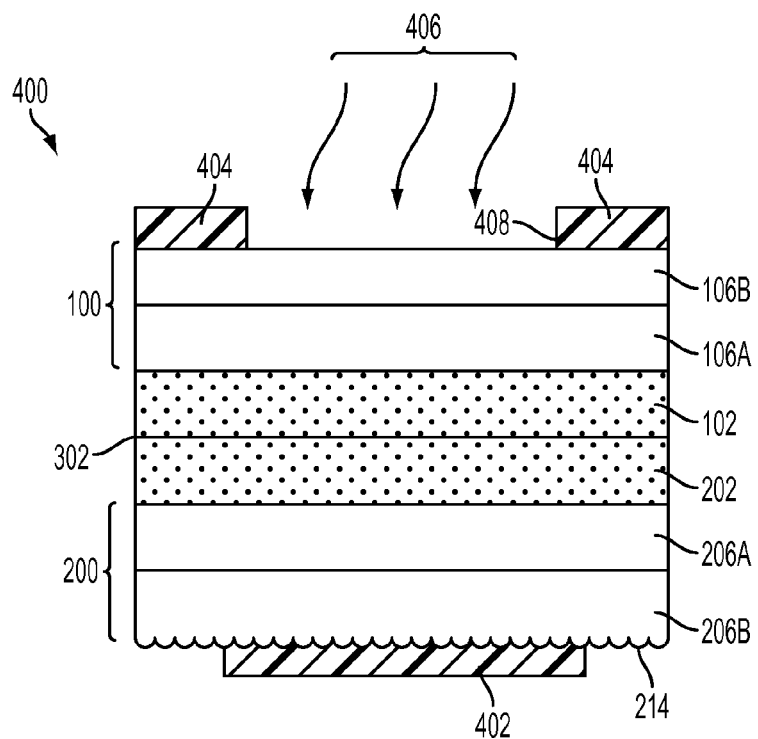
FIG. 4 is a simplified schematic diagram of a multi junction photovoltaic cell fabricated from the semiconductor structure of FIG. 2.

After attaching the first element 100 to the second element 200, the semiconductor structure 300 may be further processed to produce a multi junction photovoltaic cell 400 as shown in FIG. 4. The first growth substrate 108 (FIG. 2) optionally may be removed so as to expose a back surface 114 of the first element 100, and the second growth substrate 208 (FIG. 2) optionally may be removed so as to expose a back surface 214 of the second element 200. The growth substrates 108, 208 may be removed from the first element 100 and the second element 200, respectively, using, for example, one or more of a grinding process, a laser lift-off process, a polishing process, and a chemical (wet or dry) etching process (e.g., a chemical-mechanical polishing (CMP) process).

After removing the second growth substrate 208, the exposed back surface 214 of the second element 200 may be processed to increase a surface roughness of the back surface 214. The roughening of the back surface 214 may form a plurality of textured features (e.g., recesses and/or protrusions) and provide a resulting topography of the back surface 214.

Various techniques may be used to roughen the back surface 214 and form the texture features. By way of example and not limitation, the back surface 214 may be processed by at least one of a chemical etching process and a mechanical roughening process to increase the surface roughness of the back surface 214 of the second element 200. In some embodiments, a grinding process may be used to roughen the back surface 214 and form the textured features comprising recesses and/or protrusions in or on the back surface 214. In some embodiments, a chemical-mechanical polishing (CMP) process may be used to roughen the back surface 214 and form textured features comprising recesses and/or protrusions in or on the back surface 214. In other embodiments, a chemical etching process may be used to roughen the back surface 214 and form the textured features comprising recesses and/or protrusions in or on the back surface 214. Such a chemical etching process may employ one or both of a wet chemical etchant and a dry plasma etchant.

In some embodiments, the back surface 214 may be roughened using a photolithographic masking and etching process. In such embodiments, a mask layer may be deposited over the exposed back surface 214 of the second element 200 and selectively patterned so as to form apertures through the mask layer at the locations at which it is desired to etch into the back surface 214 so as to form apertures and/or protrusions. After forming the patterned mask layer, the regions of the back surface 214 that are exposed through the patterned mask layer may be etched using, for example, a wet etching process or a dry reactive ion etching process to remove regions of the back surface 214 of the second element 200 in a manner selected to define recesses and/or protrusions at the back surface 214. The shape of the recesses and/or protrusions defined at the back surface 214 of the second element 200 may be at least partially a function of the shape of the apertures in the patterned mask layer and the type of etching process (e.g., isotropic or anisotropic) used to etch the second element 200 through the patterned mask layer. After the etching process, the patterned mask layer may be removed. Such a masking and etching process may be used to form recesses and/or protrusions at predetermined and selected sizes and at predetermined and selected locations on the back surface 214 of the second element 200.

With continued reference to FIG. 4, methods of the present disclosure may further include formation of a first electrode 402 and a second electrode 404 between which a voltage is generated responsive to absorption of electromagnetic radiation 406 impinging on the multi junction photovoltaic cell 400. To form the first electrode 402, one or more conductive materials may be provided on the roughened back surface 214 of the second element 200. For example, a conductive metal may be deposited or otherwise provided on the roughened back surface 214 to provide an ohmic contact between the conductive metal and the second element 200. The conductive metal of the first electrode 402 may comprise, for example, tungsten (W), copper (Cu), tantalum (Ta), titanium (Ti), silver (Ag), molybdenum (Mo), or an alloy or mixture comprising one or more of such elements. In some embodiments, the conductive metal may comprise a multi-layer stack of metals including layers of different metallic compositions. The conductive metal may be deposited on the back surface 214 using one or more of a chemical vapor deposition (CVD) process, a physical vapor deposition (PVD) process, a sputtering process, an electroless plating deposition process, and an electrolytic plating deposition process.

As shown in FIG. 4, fabrication of the first electrode 402 and the second electrode 404 may be completed. Optionally, a conductive substrate (not shown) (e.g., a handle substrate) may be bonded to the conductive metal of the first electrode 402 if, for example, the conductive metal thereof is not sufficiently thick to permit handling of the structure. The conductive substrate may comprise, for example, a metal such as tungsten (W), copper (Cu), tantalum (Ta), titanium (Ti), silver (Ag), molybdenum (Mo), or an alloy or mixture comprising one or more of such elements. The conductive substrate may be bonded to the conductive metal of the first electrode 402 using, for example, a direct bonding process as previously described herein. Optionally, an additional layer of contact metal may be deposited over a surface of the conductive substrate on a side thereof opposite the conductive metal of the first electrode 402. The conductive metal, conductive substrate, and contact metal together may define the first electrode 402 in such embodiments.

With continued reference to FIG. 4, the second electrode 404 may be fabricated over the first element 100 (and over any optional additional layers) on a side thereof opposite the first electrode 402. The second electrode 404 may be formed to be discontinuous so as to define at least one aperture 408 through which the electromagnetic radiation 406 may pass and enter the active regions (near the p-n junctions) within the multi junction photovoltaic cell 400. An antireflective (AR) coating optionally may be formed that extends over the first element 100, at least within any apertures 408 in the second electrode 404.

The embodiments described herein are concerned with the attachment of two elements to one another; however, embodiments may also include multiple bonding processes comprising two or more elements (e.g., three, four or five separate elements). Multiple bonding processes may be utilized to form a plurality of subcells one over another, such that the multiple subcells each are suitable for absorbing energy from electromagnetic radiation over a relatively wide range of the solar electromagnetic radiation spectrum.

Additional non-limiting examples of embodiments of the disclosure are set forth below.

Embodiment 1

A method of fabricating a semiconductor structure, comprising: forming a first bonding layer at least substantially comprised of a first III-V material on a major surface of a first element; forming a second bonding layer at least substantially comprised of a second III-V material on a major surface of a second element; doping at least one of the first bonding layer and the second bonding layer with an n-type dopant, and selecting the n-type dopant to comprise at least one of selenium and tellurium; disposing the first bonding layer and the second bonding layer between the first element and the second element; and attaching the first element and the second element to one another at a bonding interface disposed between the first bonding layer and the second bonding layer.

Embodiment 2

The method of Embodiment 1, further comprising selecting the first III-V material to comprise an indium phosphide material.

Embodiment 3

The method of Embodiment 1 or Embodiment 2, further comprising selecting the second III-V material to comprise at least one of a gallium arsenide material and a gallium indium phosphide material.

Embodiment 4

The method of any one of Embodiments 1 through 3, wherein attaching the first element and the second element to one another comprises a direct bonding process.

Embodiment 5

The method of any one of Embodiments 1 through 4, further comprising doping at least one of the first bonding layer and the second bonding layer at a doping concentration of at least approximately $1.5 \times 10^{19}$ cm$^{-3}$.

Embodiment 6

The method of any one of Embodiments 1 through 5, wherein forming each of the first bonding layer and the second bonding further comprises epitaxially growing the first bonding layer and the second bonding layer.

Embodiment 7

The method of Embodiment 6, wherein epitaxially growing the first bonding layer and the second bonding further comprises, epitaxially growing at least one bonding surface having a surface root mean square (rms) roughness of less than 5 Angstroms as-grown.

Embodiment 8

The method of any one of Embodiments 1 through 7, wherein doping at least one of the first bonding layer and the second bonding layer with an n-type dopant reduces a wavelength of an absorption edge of the at least one of the first bonding layer and the second bonding layer by at least approximately two hundred (200) nanometers.

Embodiment 9

The method of any one of Embodiments 1 through 8, further comprising selecting at least one of the first element and the second element to comprise a tandem solar cell.

Embodiment 10

The method of any one of Embodiments 1 through 9, further comprising epitaxially growing at least one of the first bonding layer and the second bonding layer pseudomorphically.

Embodiment 11

The method of any one of Embodiments 1 through 10, wherein each of forming the first bonding layer and forming the second bonding layer comprises forming a material having an electrical resistance less than approximately 1 mΩ cm$^2$.

Embodiment 12

The method of any one of Embodiments 1 through 11, wherein each of forming the first bonding layer and forming the second bonding layer comprises forming a material at least substantially transparent to wavelengths between approximately 750 nm and approximately 920 nm.

Embodiment 13

The method of any one of Embodiments 1 through 12, further comprising fabricating a multi junction photovoltaic device from the semiconductor structure.

Embodiment 14

A semiconductor structure, comprising: a first bonding layer at least substantially comprised of a first III-V material on a major surface of a first element; a second bonding layer at least substantially comprised of a second III-V material on a major surface of a second element; wherein the first bonding layer and the second bonding layer are disposed between the first element and the second element; wherein at least one of the first bonding layer and the second bonding layer further comprises at least one n-type dopant, wherein the at least one n-type dopant comprises at least one of selenium and tellurium; and a bonding interface disposed between the first bonding layer and the second bonding layer.

Embodiment 15

The structure of Embodiment 14, wherein the first III-V material comprises an indium phosphide material.

Embodiment 16

The structure of Embodiment 14 or Embodiment 15, wherein the second III-V material comprises at least one of a gallium arsenide material and a gallium indium phosphide material.

Embodiment 17

The structure of any one of Embodiments 14 through 16, wherein the bonding interface comprises a direct bonding interface.

Embodiment 18

The structure of any one of Embodiments 14 through 17, wherein at least one of the first bonding layer and the second bonding layer comprises at least one dopant at a dopant concentration of at least approximately $1.5 \times 10^{19}$ cm$^{-3}$.

Embodiment 19

The structure of any one of Embodiments 14 through 18, wherein each of the first bonding layer and the second bonding comprises an epitaxially grown material.

Embodiment 20

The structure of Embodiment 19, wherein the epitaxially grown material further comprises at least one bonding surface having a surface root mean square (rms) roughness of less than 0.5 nanometers as-grown.

Embodiment 21

The structure of Embodiment 19 or Embodiment 20, wherein the epitaxially grown material comprises a pseudomorphic material.

Embodiment 22

The structure of any one of Embodiments 14 through 21, wherein each of the first bonding layer and the second bonding layer comprises an absorption edge wavelength of approximately two hundred (200) nanometers or less.

Embodiment 23

The structure of any one of Embodiments 14 through 22, wherein at least one of the first element and the second element comprises a tandem solar cell.

Embodiment 24

The structure of any one of Embodiments 14 through 23, wherein each of the first bonding layer and the second bonding layer comprises a material having an electrical resistance less than approximately 1 mΩ cm$^2$.

Embodiment 25

The structure of any one of Embodiments 14 through 24, wherein each of the first bonding layer and the second bonding layer comprises a material at least substantially transparent to wavelengths between approximately 750 nm and approximately 920 nm.

Embodiment 26

The structure of any one of Embodiments 14 through 25, further comprising a first electrode layer over a surface of the first element and a second electrode layer over a surface of the second element.

The example embodiments of the disclosure described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the disclosure, in addition to those shown and described herein, such as alternative useful combinations of the elements described, will become apparent to those skilled in the art from the description. Such modifications and embodiments are also intended to fall within the scope of the appended claims.

What is claimed is:

1. A method of fabricating a semiconductor structure, comprising:
    epitaxially growing a first bonding layer at least substantially comprised of an indium phosphide material on a major surface of a first element;
    epitaxially growing a second bonding layer at least substantially comprised of at least one of a gallium arsenide material and a gallium indium phosphide material on a major surface of a second element;
    doping at least one of the epitaxially grown first bonding layer and the epitaxially grown second bonding layer with an n-type dopant at a doping concentration of at least $1.5 \times 10^{19}$ cm$^{-3}$, and selecting the n-type dopant to comprise at least one of selenium and tellurium;
    disposing the epitaxially grown first bonding layer and the epitaxially grown second bonding layer between the first element and the second element; and
    attaching the first element and the second element to one another at a bonding interface disposed between the epitaxially grown first bonding layer and the epitaxially grown second bonding layer; and
    wherein the epitaxially growing of first bonding layer or the epitaxially growing of second bonding layer further comprises epitaxially growing at least one bonding surface having a surface root mean square (rms) roughness of less than 5 Angstroms as-grown.

2. The method of claim 1, wherein attaching the first element and the second element to one another comprises a direct bonding process.

3. The method of claim 1, wherein doping at least one of the epitaxially grown first bonding layer and the epitaxially grown second bonding layer at a doping concentration of at least approximately $1.5 \times 10^{19}$ cm$^{-3}$ comprises doping each of the epitaxially grown first bonding layer and the epitaxially grown second bonding layer at a doping concentration of at least approximately $1.5 \times 10^{19}$ cm$^{-3}$.

4. The method of claim 3, wherein epitaxially growing at least one bonding surface having a surface root mean square (rms) roughness of less than 5 Angstroms as-grown comprises growing a bonding surface on each of the epitaxially grown first bonding layer and the epitaxially grown second bonding layer, each of the bonding surfaces having a surface root mean square (rms) roughness of less than 5 Angstroms as-grown.

5. The method of claim 1, wherein doping at least one of the epitaxially grown first bonding layer and the epitaxially grown second bonding layer with an n-type dopant reduces a wavelength of an absorption edge of the at least one of the epitaxially grown first bonding layer and the epitaxially grown second bonding layer by at least approximately two hundred (200) nanometers.

6. The method of claim 1, further comprising selecting at least one of the first element and the second element to comprise a tandem solar cell.

7. The method of claim 1, further comprising epitaxially growing at least one of the epitaxially grown first bonding layer and the epitaxially grown second bonding layer pseudomorphically.

8. The method of claim 1, further comprising forming each of the epitaxially grown first bonding layer and the epitaxially grown second bonding layer to have an electrical resistance less than approximately 1 mQ cm2.

9. The method of claim 1, each of the epitaxially grown first bonding layer and the epitaxially grown second bonding layer to be at least substantially transparent to wavelengths between approximately 750 nm and approximately 920 nm.

10. The method of claim 1, further comprising fabricating a multi junction photovoltaic device from the semiconductor structure.

11. The method of claim 4, wherein the method does not include polishing either the bonding surface on the epitaxially grown first bonding layer or the bonding surface on the epitaxially grown second bonding layer prior to attaching the first element and the second element to one another at the bonding interface disposed between the epitaxially grown first bonding layer and the epitaxially grown second bonding layer.

* * * * *

UNITED STATES PATENT AND TRADEMARK OFFICE
CERTIFICATE OF CORRECTION

PATENT NO. : 10,014,429 B2  
APPLICATION NO. : 14/749334  
DATED : July 3, 2018  
INVENTOR(S) : Fred Newman, Frank Reinhardt and Chantal Arena Page 1 of 1

It is certified that error appears in the above-identified patent and that said Letters Patent is hereby corrected as shown below:

In the Specification

| | | |
|---|---|---|
| Column 3, | Line 32, | change "a first material." to --a first III-V material.-- |
| Column 6, | Line 21, | change "epitaxy (HYPE) process," to --epitaxy (HVPE) process,-- |

Signed and Sealed this  
Eighteenth Day of September, 2018

Andrei Iancu  
*Director of the United States Patent and Trademark Office*